United States Patent
Wu et al.

(10) Patent No.: US 8,647,989 B2
(45) Date of Patent: Feb. 11, 2014

(54) METHOD OF FORMING OPENING ON SEMICONDUCTOR SUBSTRATE

(75) Inventors: Chun-Yuan Wu, Yunlin County (TW); Chih-Chien Liu, Taipei (TW); Chin-Fu Lin, Tainan (TW); Po-Chun Chen, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 46 days.

(21) Appl. No.: 13/087,379

(22) Filed: Apr. 15, 2011

(65) Prior Publication Data

US 2012/0264306 A1   Oct. 18, 2012

(51) Int. Cl.
*H01L 21/311* (2006.01)

(52) U.S. Cl.
USPC ....... 438/702; 438/699; 438/703; 257/E21.25

(58) Field of Classification Search
USPC .......... 438/618, 637, 638; 257/741, 769, 770, 257/E21.256
See application file for complete search history.

(56) References Cited

U.S. PATENT DOCUMENTS

| 7,176,126 | B2 | 2/2007 | Oh | |
| 2004/0175932 | A1* | 9/2004 | Kim et al. | 438/637 |
| 2008/0237183 | A1* | 10/2008 | Hsieh et al. | 216/67 |
| 2008/0251284 | A1* | 10/2008 | Colburn et al. | 174/260 |
| 2008/0292798 | A1 | 11/2008 | Huh | |

* cited by examiner

*Primary Examiner* — Mohsen Ahmadi
*Assistant Examiner* — Abdulfattah Mustapha
(74) *Attorney, Agent, or Firm* — Winston Hsu; Scott Margo

(57) ABSTRACT

The present invention provides a method of forming an opening on a semiconductor substrate. First, a substrate is provided. Then a dielectric layer and a cap layer are formed on the substrate. A ratio of a thickness of the dielectric layer and a thickness of the cap layer is substantially between 15 and 1.5. Next, a patterned boron nitride layer is formed on the cap layer. Lastly, an etching process is performed by using the patterned hard mask as a mask to etch the cap layer and the dielectric layer so as to form an opening in the cap layer and the dielectric layer.

7 Claims, 5 Drawing Sheets

METHOD OF FORMING OPENING ON SEMICONDUCTOR SUBSTRATE

BACKGROUND OF THE INVENTION

1. Field of the Invention

The present invention relates to a method of forming an opening on a semiconductor substrate, and especially to a method of forming an opening by using boron nitride as a hard mask such that the phenomenon of line distortion in conventional damascene processes can be prevented.

2. Description of the Prior Art

Damascene interconnect processes incorporated with copper are known in the art, which are also referred to as "copper damascene processes" in the semiconductor industry. Generally, the copper damascene processes are categorized into single damascene process and dual damascene process. Because the dual damascene has advantages of simplified processes, lower contact resistance between wires and plugs, and improved reliance, it is widely applied in a damascene interconnect technique. In addition, for reducing resistance and parasitic capacitance of the multi-level interconnect and improving speed of signal transmission, the dual damascene interconnect in the state-of-the-art is fabricated by filling a trench or via patterns located in a dielectric layer that comprises a low-K material with copper and performing a planarization process to obtain a metal interconnect. According to the patterns located in the dielectric layer, the dual damascene processes are categorized into trench-first processes, via-first processes, partial-via-first processes, and self-aligned processes.

In conventional damascene processes, the hard mask usually includes a compressive stress which can reach to about −500 mega Pascal (MPa). When the compressive stress is directly applied to the below dielectric layer, which has low mechanical strength and tensile stress, a phenomenon of line distortion will occur on the dielectric layer. The trenches or the vias which should be originally straight will become wiggling, therefore affecting the quality of the products in the subsequent metallization process.

SUMMARY OF THE INVENTION

The present invention therefore provides a method of forming an opening on the semiconductor substrate. The method can prevent the phenomenon of line distortion in conventional arts and is especially applicable in damascene interconnect processes.

According to one embodiment of the present invention, a method of forming an opening on a semiconductor substrate is provided. First, a substrate is provided. Then a dielectric layer and a cap layer are formed on the substrate. A ratio of a thickness of the dielectric layer and a thickness of the cap layer is substantially between 15 and 1.5. Next, a patterned boron nitride layer is formed on the cap layer. Lastly, an etching process is performed by using the patterned boron nitride layer as a mask to etch the cap layer and the dielectric layer so as to form an opening in the cap layer and the dielectric layer.

According to another embodiment of the present invention, a method of forming an opening on a semiconductor substrate is further provided. First, a substrate is provided. Then a dielectric layer is formed on the substrate. Next, a patterned hard mask composite layer is formed on the dielectric layer. The patterned hard mask composite layer at least includes a metal nitride layer and a boron nitride layer. Lastly, an etching process is performed by using the patterned hard mask composite layer as a mask to etch the dielectric layer so as to form an opening therein.

According to another embodiment of the present invention, a method of forming an opening on a semiconductor substrate is further provided. First, a substrate is provided. Then a dielectric layer is formed on the substrate. Next, a patterned hard mask composite layer is formed on the cap layer. The patterned hard mask composite layer at least includes a first boron nitride layer and a second boron nitride layer. The second boron nitride layer is disposed on the first boron nitride layer and the boron concentration with respect to the whole atoms in the second boron nitride layer is different from that of the first boron nitride layer. Lastly, an etching process is performed by using the patterned hard mask composite layer as a mask to etch the dielectric layer so as to form an opening in the dielectric layer.

In the present invention, a boron nitride layer is employed as the hard mask and by using different boron concentrations or by incorporating the metal nitride layer, the hard mask composite layer can include high etch selectivity with respect to the dielectric layer and the phenomenon of line distortion can be alleviated.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be made in detail. The preferred embodiments of the present invention are illustrated in the accompanying drawings with numbered elements.

Figure 1:
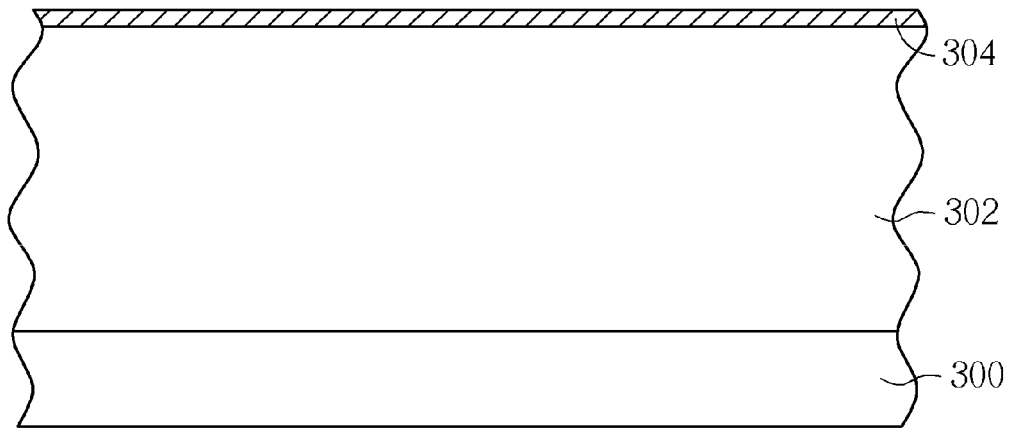
FIG. 1 to FIG. 3 are schematic diagrams of the method of forming an opening on the semiconductor substrate according to the first embodiment in the present invention.
Figure 2:
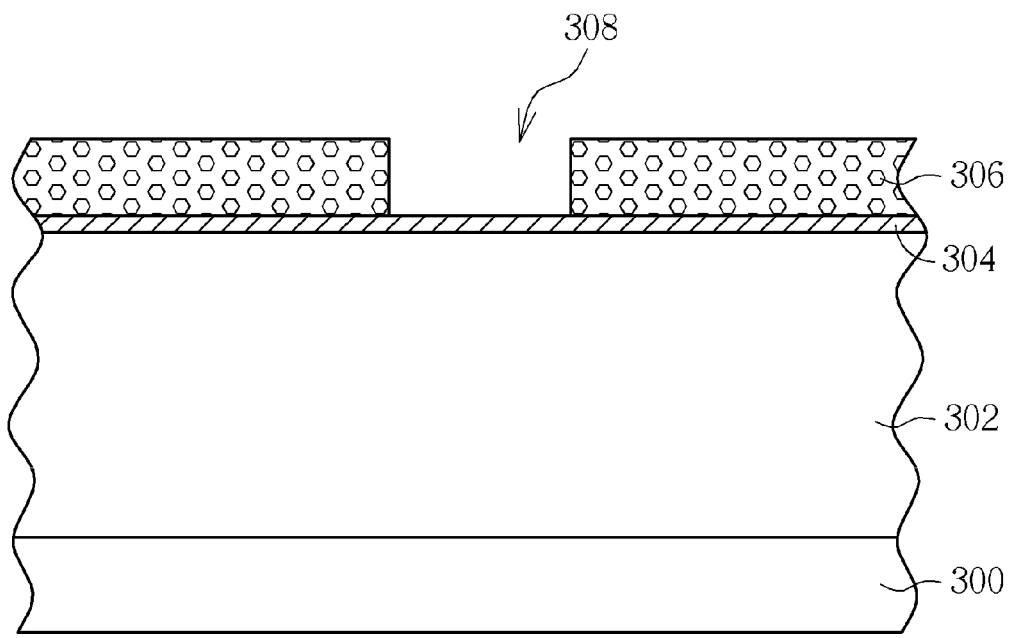
Figure 3:
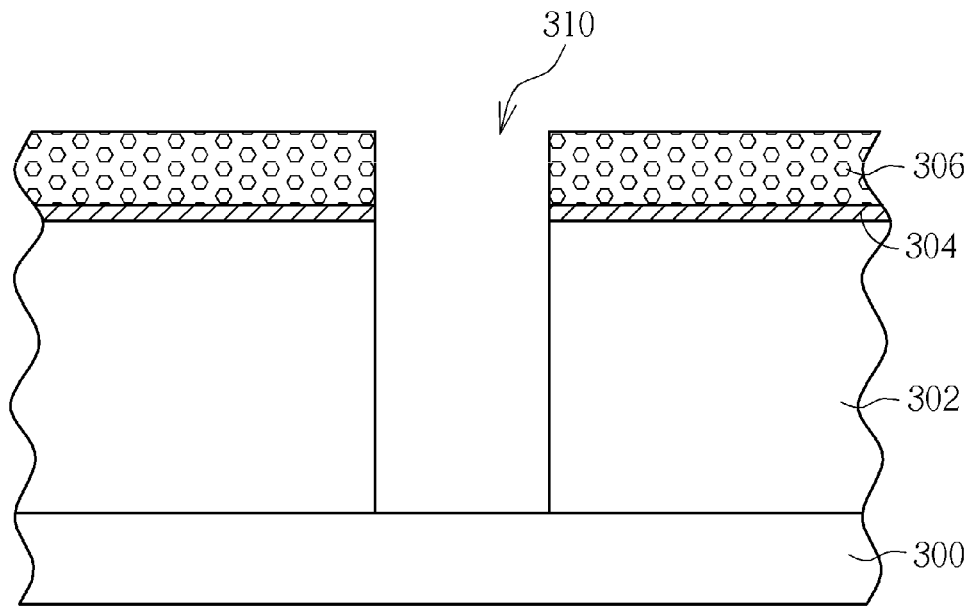

Please refer to FIG. 1 to FIG. 3, illustrating schematic diagrams of the method of forming an opening on the semiconductor substrate according to the first embodiment in the present invention. As shown in FIG. 1, firstly, a substrate 300 is provided. The substrate 300, for example, includes a silicon substrate, an epitaxial silicon substrate, a silicon germanium substrates, a silicon-on-insulator (SOI) substrate, a glass substrate, a quartz substrate, or a ceramic substrate, but should not be limited thereto. Besides, at least a conductive component (not shown) can be disposed on the substrate 300. The conductive component can be the source/drain region of CMOS, the through-silicon via (TSV), the doped region or the metal interconnection layers. Depending on different demands of products, at least an inter-layer dielectric layer (not shown) can be formed between the conductive component and the substrate 300.

Subsequently, a dielectric layer 302 is formed on the substrate 300. The method of forming the dielectric layer 302 includes a plasma enhanced chemical vapor deposition (PECVD) or a high-density plasma chemical vapor deposition, but should not be limited thereto. The dielectric layer 302 can include one dielectric layer or multi dielectric layers. The dielectric layer 302 can include a variety of dielectric materials. In one preferred embodiment of the present invention, the dielectric layer 302 includes a dielectric material having a dielectric constant substantially lower than 3.5, for example, a FSG (fluorine-doped oxide) layer, an HSQ (hydrogen silsesquioxane) (SiO:H) layer, an MSQ (methyl silsesquioxane) (SiO:CH) layer, an, HOSP layer, an H-PSSQ (hydrio polysilsesquioxane) layer, an M-PSSQ (methyl polysilsesquioxane) layer, a P-PSSQ (phenyl polysilsesquioxane) layer or a porous gel (porous sol-gel) layer, but should not be limited thereto. For example, the dielectric layer 302 can also include silicon dioxide or other suitable materials. In one preferred embodiment of the present invention, a cap layer 304 can be selectively formed on the dielectric layer 302. The cap layer 304 can increase the adhesion force between the dielectric layer 302 and the patterned hard mask layer 306 (not shown in FIG. 1) formed in the follow-up steps. The material of the cap layer 304 includes SiN, $SiO_2$, SiC, SiCN or SiON, but should not be limited thereto. A ratio of a thickness of the dielectric layer and a thickness of the cap layer is substantially between 15 and 1.5. In one embodiment, a thickness of the dielectric layer is substantially between 1000 angstroms (A) and 3000 A, and a thickness of the cap layer is substantially between 200 A and 1000 A.

As shown in FIG. 2, a patterned hard mask layer 306 is formed on the cap layer 304. For example, a hard mask layer (not shown) is deposited on the surface of the cap layer 304, and a photoresist layer (not shown) is coated on the hard mask layer. A photo-etching-process is then performed to pattern the hard mask layer, thereby forming the patterned hard mask layer 306 with an opening 308 disposed therein. The opening 308 can define the position of the opening in the dielectric layer formed in the subsequent etching process, such as the via or trench of the damascene process. It is one germane feature of the present embodiment that the patterned hard mask layer 306 is a boron nitride (BN) layer. A conventional in-situ deposition process can be used to form the boron nitride layer. For example, the boron atoms and the nitride atoms can be added together in the deposition process to form the boron nitride layer. By controlling the flow rate of the boron atoms, the boron concentration in the boron nitride layer can be adjusted. Besides, the boron nitride layer can be formed by other methods, such as an ion implantation process plus a deposition method.

As shown in FIG. 3, an etching process is performed by using the patterned hard mask layer 306 as a hard mask (or in combination with a photoresist layer thereabove) to etch the cap layer 304 and the dielectric layer 302 so as to form an opening 310 in the cap layer 304 and the dielectric layer 304. The configuration of the opening 310 (including the depth or the shape) can be adjusted according to different demands of various processes or products. For example, the opening 310 can be the trench or the via hole in the single damascene process or the dual damascene process.

Figure 4:
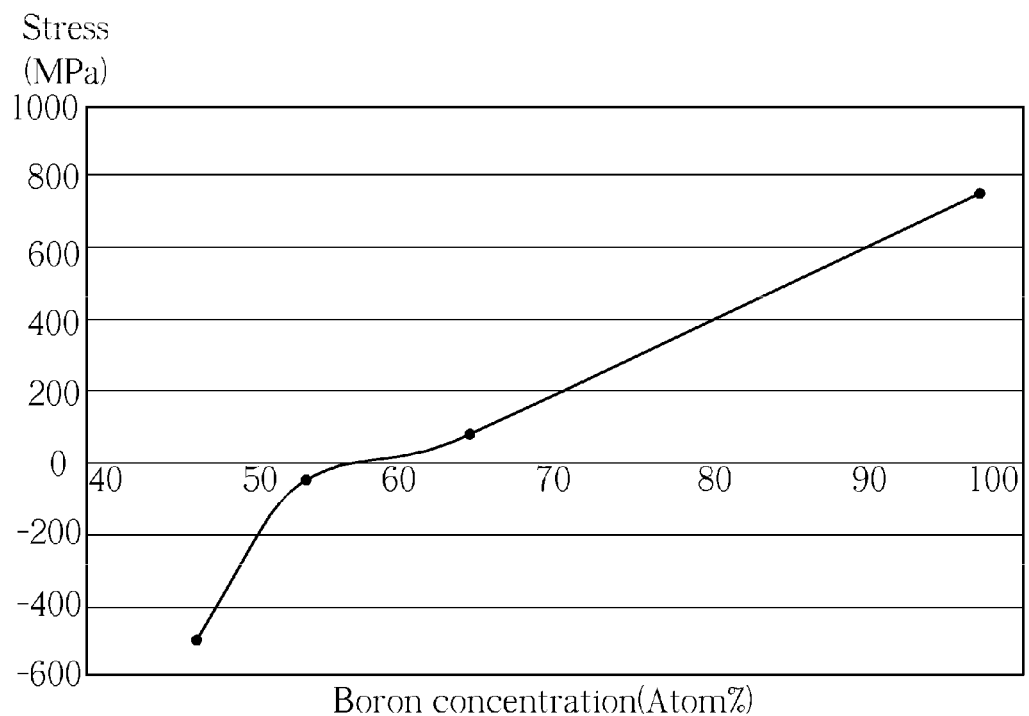
FIG. 4 is a schematic diagram of the relationship between the concentration of the boron atoms and the stress force when using boron nitride as the patterned hard mask.

By using the boron nitride as the patterned hard mask layer 306, the phenomenon of line distortion caused by excessive compressive stress of the hard mask layer in conventional arts can be avoided. Please refer to FIG. 4, illustrating a schematic diagram of the relationship between the concentration of the boron atoms and the stress force when using boron nitride as the patterned hard mask. The horizontal axis presents the percentage of the boron with respect to whole atoms in the patterned hard mask (unit: %) while the vertical axis presents the stress force value (unit: MPa). As shown in FIG. 4, with the increasing of the boron concentration in the hard mask layer 306, the stress force is gradually converted from the compressive stress (−500 MPa) to the tensile stress (750 Mpa). Accordingly, if the boron concentration is properly adjusted, different stress forces of the hard mask layer 306 can be provided. In this way, the stress of the dielectric layer 302 can be tuned, and the phenomenon of line distortion on the inner surface of the opening 310 can be prevented after the etching process.

Figure 5:
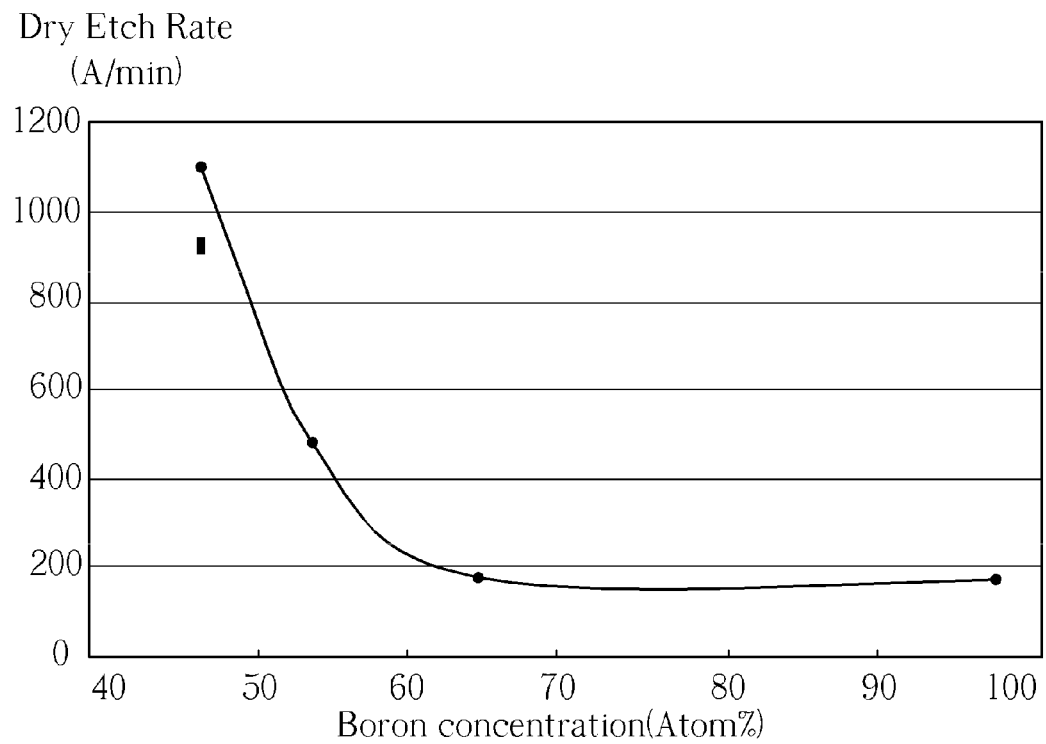
FIG. 5 is a schematic diagram of the relationship between the concentration of the boron atoms and the stress force when using boron nitride as the patterned hard mask.

Please refer to FIG. 5, illustrating a schematic diagram of the relationship between the concentration of the boron atoms and the etching rate when using boron nitride as the patterned hard mask. The horizontal axis presents the percentage of the boron with respect to whole atoms in the patterned hard mask (unit: %) while the vertical axis presents the etching rate (unit: A/min). As shown in FIG. 5, with the increasing of the boron concentration in the hard mask layer 306, the etching rate is gradually getting lower. With comparison with the etching rate of the dielectric layer 302 (presented by a square point in FIG. 5) which is about 920 A/min, it is noted that when the boron concentration is increasing in the patterned hard mask layer 306, the etch selectivity with respect to the dielectric layer 302 is also rising.

As shown in FIG. 4 and FIG. 5, the boron concentration in the patterned hard mask layer 306 would affect the stress force, as well as the etch selectivity with respect to the dielectric layer 302. Thus, appropriate boron concentration in the patterned hard mask 306 is required. In one preferred embodiment of the present invention, the boron concentration with respect to whole atoms in the patterned hard mask layer 306 is substantially between 50% and 80%, preferably between 60% and 70%, and 65% would be the best. In addition, in one preferred embodiment of the present invention, the patterned hard mask layer 306 includes a stress substantially between −50 MPa and 400 MPa, preferably between 10 MPa and 100 MPa, and 65 MPa would be the best.

Figure 6:
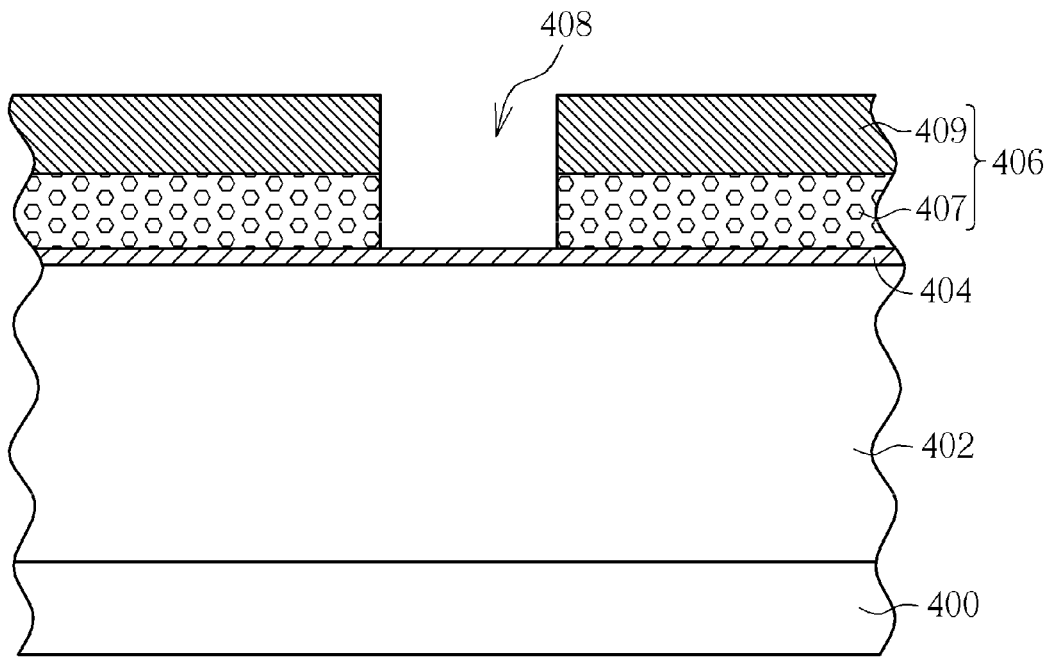
FIG. 6 and FIG. 7 are schematic diagrams of the method of forming an opening on the semiconductor substrate according to the second embodiment in the present invention.
Figure 7:
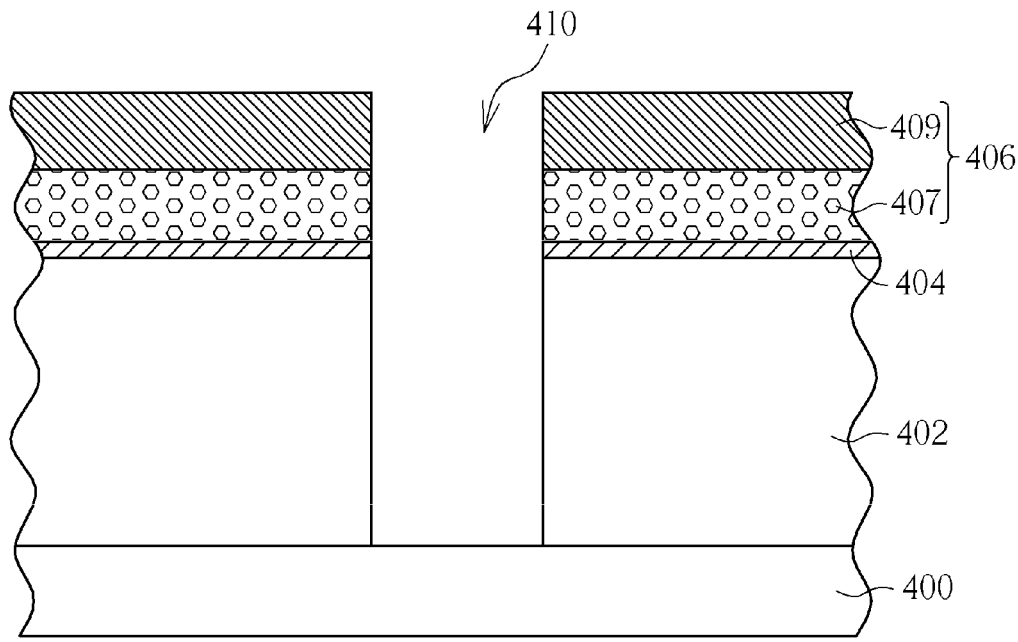

Please refer to FIG. 6 and FIG. 7, illustrating schematic diagrams of the method of forming an opening on the semiconductor substrate according to the second embodiment in the present invention. As shown in FIG. 6, a substrate 400 is provided. Then, a dielectric layer 402 and an optional cap layer 404 are formed on the substrate 400. The embodiments of the substrate 400, the dielectric layer 402 and the cap layer 404 are similar to those of the first embodiment and will not be repeated. Subsequently, a patterned hard mask layer 406 with an opening 408 is formed on the dielectric layer 402 (or the optional capping layer 404). In the present embodiment, the patterned hard mask layer 406 includes a composite structure, which at least includes a boron nitride layer 407 and a metal nitride layer 409. The position or the lamination numbers of the boron nitride layer 407 and the metal nitride layer 409 can be adjusted according to different demands of products. In one preferred embodiment of the present invention, the metal nitride layer 409 is disposed on the boron nitride layer 407. In one preferred embodiment, the metal nitride layer 409 includes titanium nitride (TiN). The embodiment of the boron nitride layer 407 is similar to that of the first embodiment and will not be repeated. Finally, as shown in FIG. 7, an etching process is performed by using the patterned hard mask layer 406 as a mask to etch the dielectric layer 402 and the cap layer 404 so as to form an opening 410 in the dielectric layer 402 and the cap layer 404. In the present embodiment, since the metal nitride layer 409 is disposed on the silicon nitride layer 407, the metal nitride layer 409 such as titanium nitride layer can provide a better etch selectivity with respect to the dielectric layer 402 in the etching process, while the boron nitride layer 407 which is closer to the dielectric layer 402 can tune the stress of the dielectric layer 402 so as to avoid the phenomenon of line distortion in conventional arts.

Figure 8:
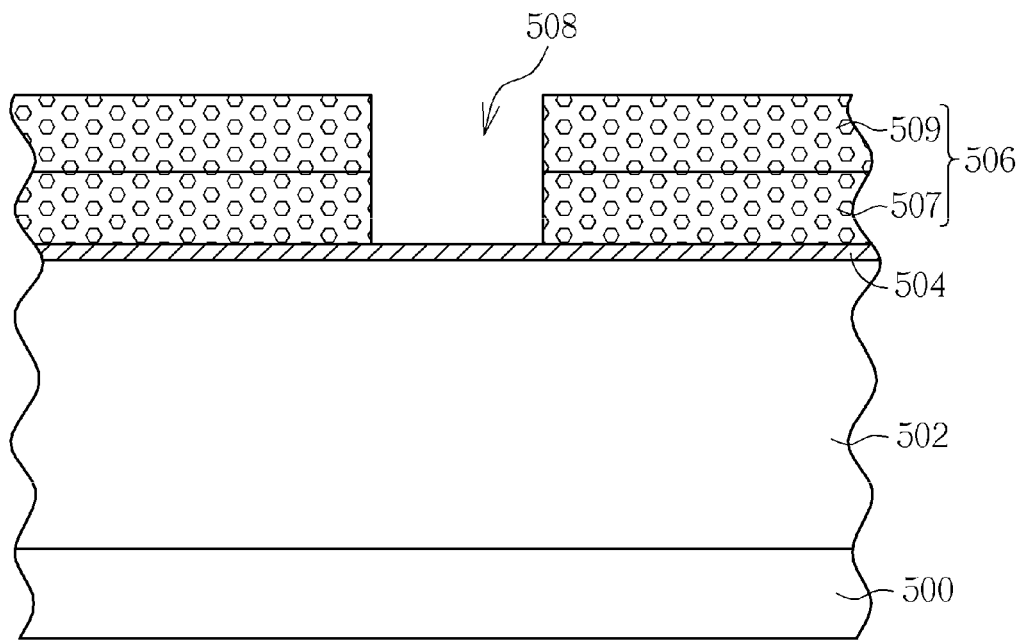
FIG. 8 and FIG. 9 are schematic diagrams of the method of forming an opening on the semiconductor substrate according to the third embodiment in the present invention.
Figure 9:
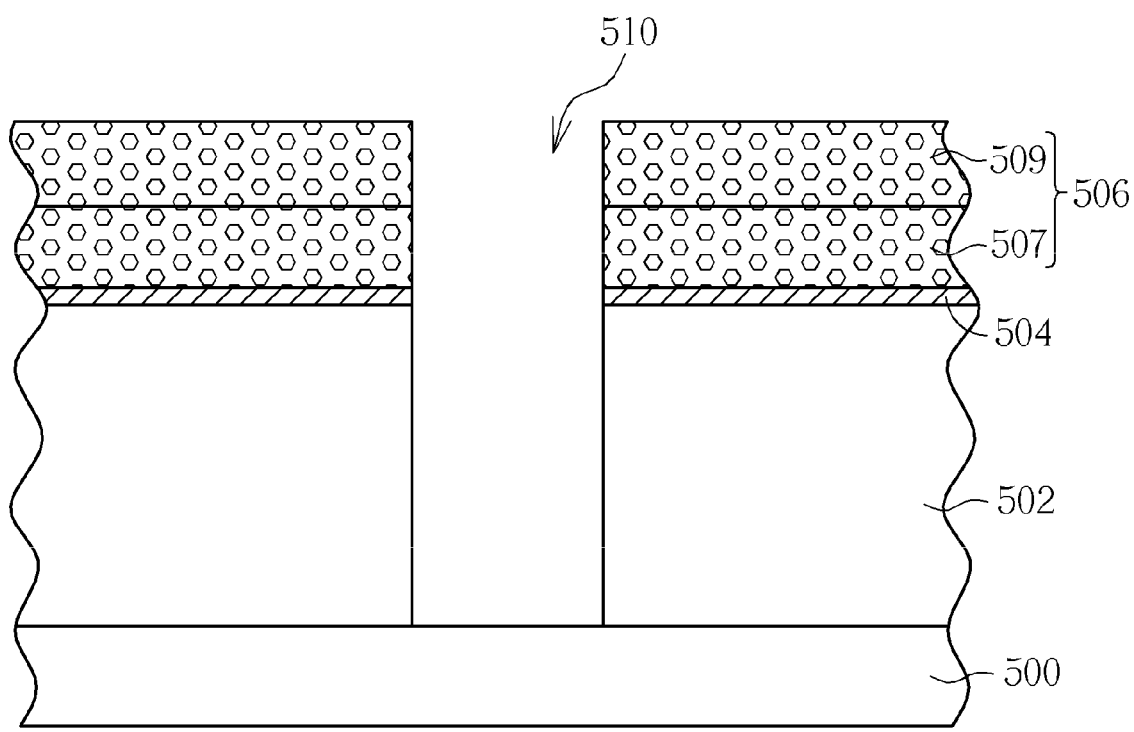

Please refer to FIG. 8 and FIG. 9, illustrating schematic diagrams of the method of forming an opening on the semiconductor substrate according to the third embodiment in the present invention. As shown in FIG. 9, a substrate 500 is provided. Then, a dielectric layer 502 and an optional cap layer 504 are formed on the substrate 500. The embodiments of the substrate 500, the dielectric layer 502 and the cap layer 504 are similar to those of the first embodiment and will not be repeated. Subsequently, a patterned hard mask layer 506 with an opening 508 is formed on the dielectric layer 502 (or the optional capping layer 504). In the present embodiment, the patterned hard mask layer 506 includes a composite structure, which at least includes a first boron nitride layer 507 and a second boron nitride layer 509. In the present embodiment, the boron concentration of the first boron nitride layer 507 and the second boron nitride layer 509 is substantially between 50% and 80%. The boron concentration in the second boron nitride layer 509 is different from that of the first boron nitride layer 507. Preferably, the boron concentration in the second boron nitride layer 509 is greater than that of the first boron nitride layer 507. Finally, as shown in FIG. 9, an etching process is performed by using the patterned hard mask layer 506 as a mask to etch the dielectric layer 502 and the cap layer 504 so as to form an opening 510 in the dielectric layer 502 and the cap layer 504. In the present embodiment, since the second boron nitride layer 509 having a greater boron concentration is disposed on the first boron nitride layer 507 having a lower boron concentration, the second boron nitride layer 509 can provide a better etch selectivity with respect to the dielectric layer 502 in the etching process, while the first boron nitride layer 507 which is closer to the dielectric layer 502 can tune the stress of the dielectric layer 502 so as to avoid the phenomenon of line distortion in conventional arts.

It is noted that, the patterned hard mask composite layer 506 in the third embodiment is not limited to including the first boron nitride layer 507 and the second boron nitride layer 509. In another related embodiments, the patterned hard mask layer 506 can further include a third boron nitride layer (not shown) disposed on the second boron nitride layer 509, or a fourth boron nitride layer (not shown) disposed on the third boron nitride layer. It is one feature that the boron concentration of the upper boron nitride layer is greater than that of the lower boron nitride layer. In another embodiment of the present invention, the third embodiment can also be incorporated with the second embodiment. For example, the patterned hard mask layer 507 can include a plurality of boron nitride layers and one or a plurality of metal nitride layers such as a TiN layer is disposed on the plurality of boron nitride layers.

In addition, the method of forming an opening on the semiconductor substrate provided in the preset invention is especially applicable in the metal interconnection manufacturing process such as single damascene process or dual damascene process. For example, when a conductive component such as a lower interconnection feature is disposed on the substrate, an opening can be formed by using the method provided in the present invention to expose the conductive component. Next, a conductive material can be filled into the opening and then is subjected to a CMP process. Thus, the conductive component can electrically connected to the conductive material and the metal interconnection system can be formed.

In light of above, the present invention provides a method of forming an opening in a semiconductor substrate. In the present invention, a boron nitride layer is employed as the hard mask and by using different boron concentrations or by incorporating the metal nitride layer, the hard mask composite layer can include high etch selectivity with respect to the dielectric layer and the phenomenon of line distortion can be alleviated. In addition, due to the poor adhesion between the low-k dielectric layers and boron nitride layer, a cap layer is provided in the present invention to increase the adhesion force between the dielectric layer and the boron nitride layer. In particular, the present invention can especially be used in metal interconnect system manufacturing processes such as single damascene process or dual damascene process to avoid the phenomenon of line distortion of the trench and the via hole.

Those skilled in the art will readily observe that numerous modifications and alterations of the device and method may be made while retaining the teachings of the invention.

What is claimed is:

1. A method of forming an opening on the semiconductor substrate, comprising:
   providing a substrate;
   forming a dielectric layer on the substrate;
   forming a patterned hard mask composite layer on the dielectric layer, wherein the patterned hard mask composite layer comprises:
   a metal nitride layer; and
   a boron nitride layer, wherein the metal nitride layer is disposed directly on the boron nitride layer; and
   performing an etching process by using the patterned hard mask composite layer as a mask to etch the dielectric layer so as to form an opening in the dielectric layer.

2. The method of claim 1, further comprising forming a cap layer between the dielectric layer and the patterned hard mask composite layer, and forming the opening in the cap layer during the etching process.

3. The method of claim 1, wherein in the boron nitride layer, the boron concentration with respect to whole atoms in the boron nitride layer is substantially between 50% and 80%.

4. The method of claim 1, wherein in the boron nitride layer, the boron concentration with respect to whole atoms in the boron nitride layer is substantially between 60% and 70%.

5. The method of claim 1, wherein the boron nitride layer comprises a stress substantially between −50 MPa and 400 MPa.

6. The method of claim 1, wherein the boron nitride layer comprise a stress substantially between 10 MPa and 100 MPa.

7. The method of claim 1, wherein the cap layer comprises SiN, $SiO_2$, SiC, SiCN or SiON.

* * * * *